United States Patent [19]

Nogle et al.

[11] Patent Number: 5,229,967
[45] Date of Patent: Jul. 20, 1993

[54] BICMOS SENSE CIRCUIT FOR SENSING DATA DURING A READ CYCLE OF A MEMORY

[76] Inventors: Scott G. Nogle, 12811 Meehan dr., Austin, Tex. 78727; Robert P. Dixon, 444 N. Gila Springs Blvd., #2062, Chandler, Ariz. 85226; Walter C. Seelbach, 12009 Organ Pipe Cir., Fountain Hills, Ariz. 85267

[21] Appl. No.: 577,375

[22] Filed: Sep. 4, 1990

[51] Int. Cl.$^5$ ............................................. G11C 11/40
[52] U.S. Cl. ................................... 365/208; 365/177; 365/189.06; 365/189.09; 365/190; 365/203; 307/495; 307/530
[58] Field of Search ............... 365/154, 155, 156, 177, 365/179, 181, 189.06, 190, 203, 205, 206, 207, 208, 189.09; 307/495, 496, 499, 530

[56] References Cited

U.S. PATENT DOCUMENTS

| | | | |
|---|---|---|---|
| 4,740,921 | 8/1988 | Lewandowski et al. | 365/203 |
| 4,802,129 | 1/1989 | Hoekstra et al. | 365/190 |
| 4,821,232 | 4/1989 | Nakano et al. | 365/190 |
| 4,829,479 | 5/1989 | Mitsumoto et al. | 365/190 |
| 4,853,899 | 8/1989 | Kitsukawa et al. | 365/177 |
| 4,866,674 | 9/1989 | Tran | 365/189.11 |
| 4,899,317 | 2/1990 | Hoekstra et al. | 365/203 |
| 4,928,268 | 5/1990 | Nogle | 365/230.03 |
| 4,984,207 | 1/1991 | Tateno et al. | 307/530 |
| 4,985,864 | 1/1991 | Pice | 365/203 |
| 5,043,945 | 8/1991 | Bader | 365/190 |
| 5,058,067 | 10/1991 | Kertis | 365/190 |

FOREIGN PATENT DOCUMENTS

| | | | |
|---|---|---|---|
| 0263390 | 12/1985 | Japan | 365/203 |
| 0091886 | 3/1990 | Japan | 365/203 |

OTHER PUBLICATIONS

Tran et al., "An 8ns BICMOS 1Mb ECL SRAM with a Configurable Memory Array Size", 1989 IEEE Solid State Circuits Conference, pp. 36–37.

Kertis et al., "A 12ns 256K BICMOS SRAM", 1989 IEEE Solid State Circuits Conference, pp. 186–187.

Burnett and Hu, "Hot-Carrier Degradation in Bipolar Transistors at 300 and 110 K-Effect on BICMOS Inverter Performance", IEEE Transactions on Electron Devices, v. 37, No. 4, Apr. '90, pp. 1171–1172.

Odaka et al. "A 512kb/5ns BICMOS RAM with 1kG/150ps Logic Gate Array", 1989 IEEE Solid State Circuits Conference, pp. 28–29.

*Primary Examiner*—Joseph L. Dixon
*Assistant Examiner*—Jack A. Lane
*Attorney, Agent, or Firm*—Maurice (Jay) Jones; Paul J. Polansky

[57] ABSTRACT

A bipolar complementary metal oxide semiconductor (BICMOS) sense circuit for sensing data on read data lines during a read cycle of a memory comprises a load portion and a sense amplifier portion. In one form, the load portion couples true and complement read data lines to a first voltage in response to a start of a read cycle. When the true and complement read data lines exceed a predetermined voltage, the sense amplifier is enabled. The load portion becomes inactive when the voltage on the read data lines reaches approximately the first voltage. Then a selected memory cell provides a differential voltage on a bit line pair, which is coupled to the read data lines, indicating the contents of the selected memory cell. The sense amplifier provides a differential current onto a corresponding read global data line pair in response to the differential voltage. At the termination of the read cycle, the load portion becomes active again and couples the read data lines to a second voltage to disable the sense amplifier. The predetermined voltage is between the first voltage and the second voltage. The circuit increases the speed of the sensing function over a CMOS design, while keeping power consumption to a minimum. In another form, the sense circuit generates a read sense voltage that is substantially independent of non-tracking process variations between P-channel and N-channel field-effect transistors.

6 Claims, 6 Drawing Sheets

BICMOS SENSE CIRCUIT FOR SENSING DATA DURING A READ CYCLE OF A MEMORY

CROSS-REFERENCE TO RELATED, COPENDING APPLICATION

Related copending application is application Ser. No. 07/548,809, filed Jun. 29, 1990, by Scott G. Nogle and assigned to the assignee hereof and entitled "A BICMOS BIT Line Load for a Memory With Improved Reliability and a Method Therefor".

FIELD OF THE INVENTION

This invention relates generally to sense amplifier circuits, and more particularly, to BICMOS sense amplifier circuits for high speed integrated circuit memories.

BACKGROUND OF THE INVENTION

In a memory, memory cells are located at intersections of word lines and bit line pairs. A row decoder activates one word line, and memory cells located on the activated word line provide their contents to corresponding bit line pairs. Then column decoding selects at least one bit line pair, and the number of bit line pairs selected depends on the organization of the memory. A selected memory cell is located at an intersection of an activated word line and a selected bit line pair. During a read cycle, a selected bit line pair is coupled to a data line pair. A sense amplifier detects the contents of the selected memory cell on the data line pair and provides it to additional circuitry for output. The speed of the sensing operation determines the access time of the memory.

Memories continually require faster access times to be commercially competitive. At the same time, other constraints like power consumption exist. Integrated circuit fabrication techniques have made both bipolar transistors and CMOS transistors (BICMOS) manufacturable on a single integrated circuit. BICMOS circuits are generally faster than CMOS circuits, but consume more power. Thus, a memory sensing scheme using CMOS transistors only may no longer be desirable when BICMOS technology exists.

DESCRIPTION OF THE PREFERRED EMBODIMENT

Accordingly, there is provided, in one form, a sense circuit comprising first and second bipolar transistors, first and second MOS transistors, and a sense amplifier. The first and second bipolar transistors each have both a collector and a base for receiving a select signal, and emitters respectively coupled to true and complement read data lines of a read data line pair. The first and second MOS transistors each have a first current electrode for receiving the select signal, a control electrode for receiving a first bias signal, and have second current electrodes respectively coupled to the true and complement read data lines. The sense amplifier has positive and negative input terminals respectively coupled to the true and complement read data lines, a positive output terminal coupled to a first read global data line, and a negative output terminal coupled to a second read global data line. The sense amplifier provides a first differential current between the positive and negative output terminals proportional to a difference in voltage between the positive and negative input terminals when either a voltage on the positive input terminal or a voltage on the negative input terminal exceeds a predetermined voltage. The sense amplifier also provides second and third currents each substantially equal to zero respectively to the first and second read global data lines when both the voltage on the positive input terminal and the voltage on the negative input terminal do not exceed the predetermined voltage.

These and other objects, features and advantages will be more clearly understood from the following detailed description taken in conjunction with the accompanying drawings.

DETAILED DESCRIPTION OF THE INVENTION

Figure 1:
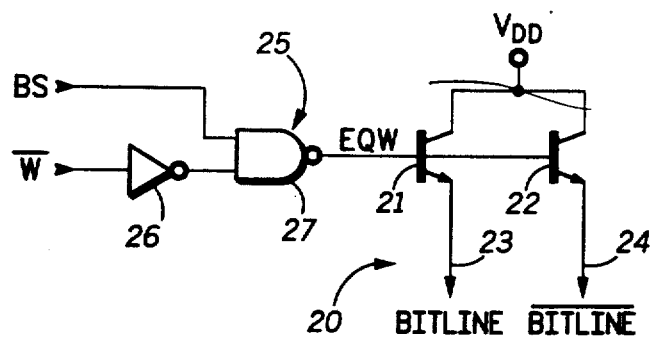
FIG. 1 illustrates in partial schematic form a bit line load in accordance with the prior art and a control circuit therefor.

FIG. 1 illustrates in partial schematic form a bit line load 20 in accordance with the prior art, and control circuit 25 therefor. See, for example, "Bitline Pull-Up Circuit for a BICMOS Read/Write Memory" by Tran in U.S. Pat. No. 4,866,674, issued Sep. 12, 1989; Kertis et. al., "A 12ns 256K BiCMOS SRAM", in 1989 *IEEE Solid State Circuits Conference*, p. 187. Bit line load 20 comprises an NPN transistor 21 having a collector connected to a positive power supply voltage terminal labelled "$V_{DD}$", a base for receiving a signal labelled "EQW", and an emitter coupled to a bit line 23 having a signal labelled "BITLINE" thereon; and an NPN transistor 22 having a collector connected to $V_{DD}$, a base for receiving signal EQW, and an emitter coupled to a bit line 24 having a signal labelled "$\overline{\text{BITLINE}}$" thereon. Control circuit 25 comprises an inverter 26 having an input terminal for receiving a write signal labelled "$\overline{W}$", and an output terminal; and a NAND gate 27 having a first terminal for receiving a block select signal labelled "BS", a second input terminal connected to the output terminal of inverter 26, and an output terminal for providing EQW.

Signal EQW causes transistors 21 and 22 to precharge bit lines 23 and 24. EQW is asserted in response to either signal BS being negated as a logic low, or signal $\overline{W}$ being negated as a logic high. A write recovery period occurs between a time at which either BS or $\overline{W}$ is negated, until voltages bitlines 23 and 24 are substantially equal. EQW is negated in response to both signals BS and $\overline{W}$ being asserted, indicating a write access to the memory block in which bit line load 20 is located. When EQW is asserted, transistors 21 and 22 increase the voltage on the corresponding bit line, bit line 23 or bit line 24 respectively, to a base-to-emitter threshold voltage ($V_{BE}$) below EQW. Also typically an MOS transistor, coupled between bit line 23 and bit line 24 (not shown in FIG. 1), is made conductive to equalize the voltage therebetween. Because bit line load 20 uses bipolar transistors 21 and 22, the speed of precharging of the voltage on the bit lines after the termination of the write cycle is improved over the use of CMOS transistors.

There is a problem with bit line load 20, however. During the write recovery period, bit line load 20 provides a voltage on bit lines 23 and 24 equal to approximately (EQW$-V_{BE}$). However, during a write cycle EQW is negated to a logic low. NAND gate 27, typically implemented using CMOS transistors, provides EQW at a logic low voltage very close to the negative power supply voltage, designated "$V_{SS}$", typically at zero volts. Hence, a large reverse bias is developed between the emitter and the base of either transistor 21 or transistor 22. If the maximum reverse bias is designated "$V_{RBMAX}$", then $$V_{RBMAX} = EQW - V_{BE} - V_{SS} \quad (1)$$

If EQW is equal to 5 volts, $V_{BE}$ is equal to 0.7 volts, and $V_{SS}$ is equal to 0 volts, $V_{RBMAX}$ would equal 4.3 volts. Over time, the constant application of this large reverse bias may cause transistor 21 or transistor 22 to fail, resulting in a failure of the entire memory. Electronically, a large reverse bias on a PN junction causes hot carrier injection into the overlying oxide, resulting in poor junction performance. See, for example, "Hot-Carrier Degradation in Bipolar Transistors at 300 and 110K—Effect on BiCMOS Inverter Performance", by Burnett and Hu in *IEEE Transactions on Electron Devices*, vol. 37, no. 4, April 1990, pp. 1171-1173. The amount of hot carrier injection is proportional to the time the reverse bias occurs. The size of $V_{RBMAX}$ is related to the mean life of the transistor, for given worst case conditions, by an inverse semilogarithmic relationship; as $V_{RBMAX}$ decreases linearly, mean life increases exponentially. At a $V_{RBMAX}$ of 4.3 volts, transistor mean life of bit line load 20 is unacceptably short.

Figure 2:
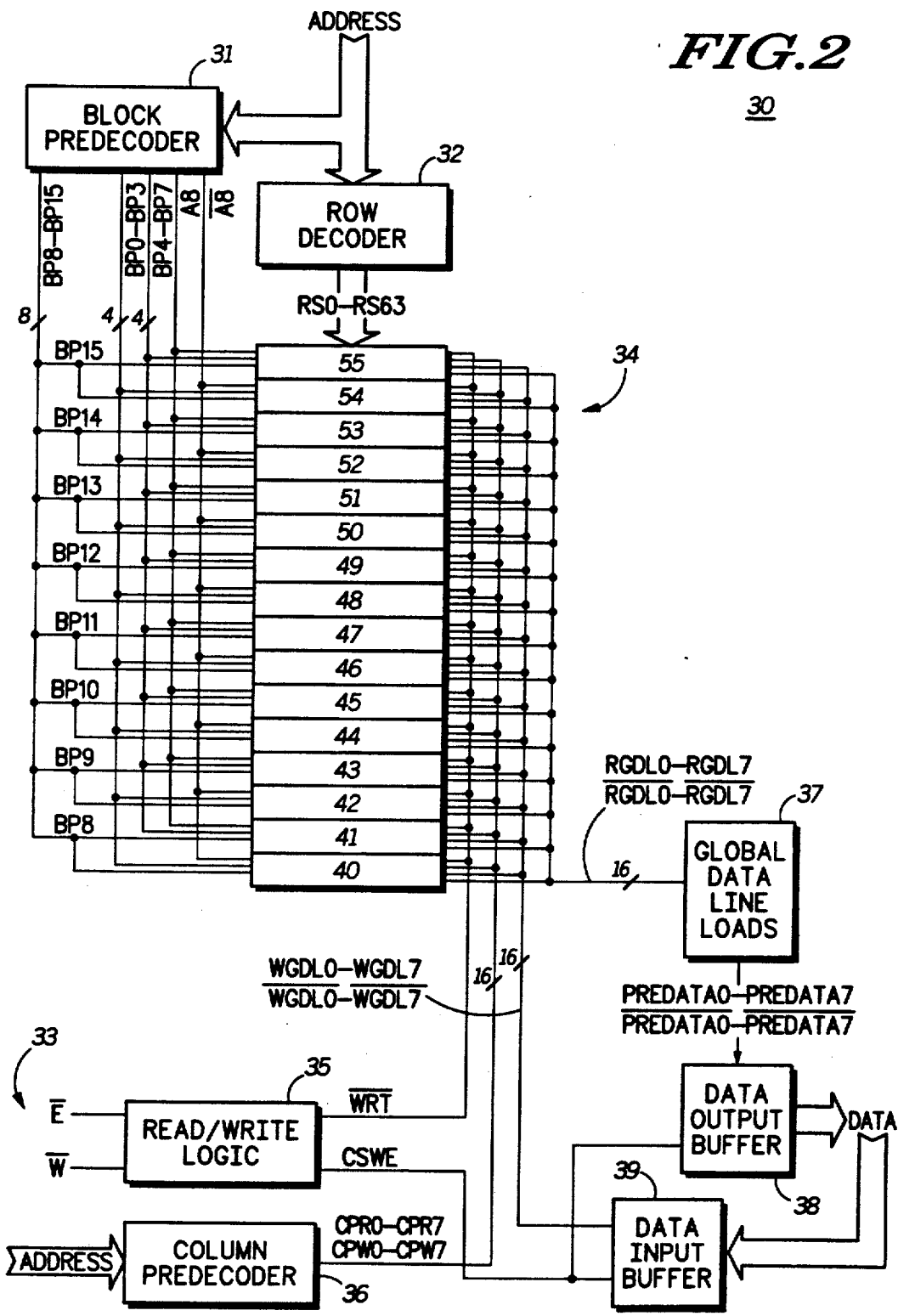
FIG. 2 illustrates in block form a memory incorporating the present invention.

FIG. 2 illustrates in block form a memory 30 incorporating the present invention. FIG. 2 shows features pertinent to understanding the present invention, but omits other features. Memory 30 comprises generally a block predecoder 31, a row decoder 32, an input/output portion 33, and a memory block portion 34. Input/output portion 33 comprises a read/write logic block 35, a column predecoder 36, a global data line load portion 37, a data output buffer 38, and a data input buffer 39. Memory block portion 34 comprises a plurality of memory blocks; in the illustrated embodiment, memory block portion 34 comprises sixteen memory blocks 40-55.

Block predecoder 31 receives a first portion of a plurality of address signals labelled "ADDRESS" and provides predecoded block signals labelled "A8", "$\overline{A8}$", "BP0-BP3", "BP4-BP7", and "BP8-BP15" in response. A particular memory block receives a unique combination of predecoded block signals which determines when the block is selected. Even-numbered memory blocks receive $\overline{A8}$, whereas odd-numbered blocks receive A8; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0-BP3, whereas odd-numbered memory blocks receive BP4-BP7, for further decoding. Row decoder 32 receives a second portion of ADDRESS and provides row select signals labelled "RS0-RS63" in response. RS0-RS63 are provided to each memory block.

Read/write logic block 35 receives as inputs an enable signal labelled "$\overline{E}$", and a write signal labelled "$\overline{W}$". Read/write logic block 35 provides a write signal labelled "$\overline{WRT}$" to each of memory blocks 40-55, and a control signal labelled "CSWE" to data output buffer 38 and data input buffer 39 in response. $\overline{WRT}$ is a buffered signal indicating a write cycle is in progress. CSWE is a signal indicating that either a read cycle or a write cycle is in progress. Column predecoder 36 receives a third portion of ADDRESS and provides a plurality of predecoded column signals labelled "CPR0-CPR7" and "CPW0-CPW7" in response. Global data line loads 37 couple to each of 8 differential global data line pairs labelled "RGDL0-RGDL7" and "$\overline{RGDL0}$-$\overline{RGDL7}$". Global data line loads 37 provide signals labelled signals labelled "PREDATA0–PREDATA7" and "$\overline{PREDATA0}$-$\overline{PREDATA7}$" in response. Data output buffer 38 couples to $\overline{PREDATA0}$-$\overline{PREDATA7}$ and PREDATA0–PREDATA7 and provides a plurality of data signals labelled "DATA" in response. The number of signals in DATA corresponds to the number of global data line pairs; here, there are eight data signals provided on DATA. However, the number of data bits provided by memory 30 may vary in different embodiments so the number of data signals in DATA is left indeterminate to illustrate this. Data input buffer 39 receives DATA and provides 8 write data line signal pairs labelled "WGDL0-WGDL7" and "$\overline{WGDL0}$-$\overline{WGDL7}$" in response.

FIG. 2 is useful in understanding the operation of a memory in which the present invention operates. Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0-RS63 and a plurality of predecoder block signals received from block predecoder 31. Column decoding decodes eight bit line pairs out of 64 bit line pairs on the enabled local word line. Row redundancy is also possible but is not shown in FIG. 2. The organization of memory 30 may be altered in different embodiments, as well as which portions of ADDRESS are used respectively for row and column decoding.

In the read cycle, signal $\overline{E}$ is asserted and signal $\overline{W}$ is negated. Read/write logic block 35 keeps signals $\overline{WRT}$ and CSWE negated. Block predecoder 31 selectively asserts signals A8, $\overline{A8}$, and BP0-BP15 in response to the first portion of ADDRESS. Row decoder 32 selectively asserts a row select signal of RS0-RS63 in response to the second portion of ADDRESS. The memory block selected by the predecoded signals A8, $\overline{A8}$, and a corresponding signal from the group BP8-BP15, then uses the remaining predecoded signals BP0-BP7, along with an active row select signal of RS0-RS63, to activate one local word line. Then within the selected block, each memory cell on the activated local word line provides its contents onto a corresponding differential bit line pair. Further column decoding among the bit line pairs is performed using CPR0-CPR7. The type of cycle in progress determines which signal is asserted, either one of CPR0-CPR7 for a read cycle, or one of CPW0-CPW7 for a write cycle. During the read cycle, one signal of CPR0-CPR7 is asserted to select one of eight bit line pairs in a selected memory block to output on a corresponding global data line pair. Thus, CPR0-CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by global data line loads 37 which convert the output of the memory blocks, a differential current, into a differential voltage on signals PREDATA0-PREDATA7 and $\overline{PREDATA0}$-$\overline{PREDATA7}$. The data bits represented differentially as PREDATA0-PREDATA7 and $\overline{PREDATA0}$-$\overline{PREDATA7}$ are then provided externally to memory 30 by data output buffer 38.

In the write cycle, the flow of data is essentially reversed. Data input buffer 39 receives DATA and provides each data bit differentially onto a corresponding write global data line pair in response. Since memory 30 is organized to store or provide eight data bits of memory per access, DATA is provided on eight differential write global data line pairs WGDL0-WGDL7 and $\overline{WGDL0}$-$\overline{WGDL7}$. Signals CPW0-CPW7 from column predecoder 36 are used in a selected memory block to perform column decoding to couple the eight write global data lines to eight bit line pairs. During the write cycle, one signal of CPW0-CPW7 is asserted to select one of eight bit line pairs in a selected memory block to output on a corresponding global data line pair. Thus, CPW0-CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

Figure 3:
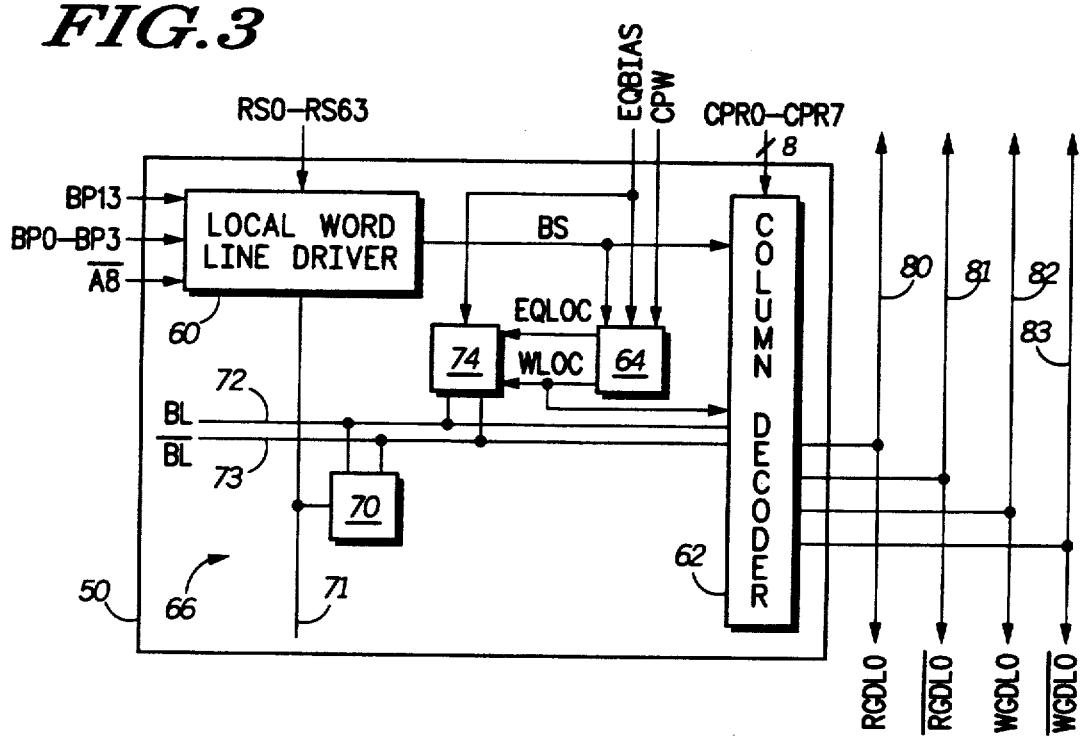
FIG. 3 shows a block diagram of a portion of a memory block of the memory of FIG. 2.

FIG. 3 illustrates in block form a portion of memory block 50 of memory 30 of FIG. 2. Memory block 50 comprises a local word line driver block 60, a column decoder 62, a control signal generator circuit 64, and a memory array 66. Local word line driver block 60 provides 256 local word line signals, including a representative local word line 71, in response to input row select signals RS0-RS63, block signals BP0-BP3 and BP13, and A8. In addition, it provides a block select signal labelled "BS" in response to BP13 and A8. Memory array 66 comprises a plurality of memory cells at each intersection of a local word line and a bit line pair. In FIG. 3, a representative memory cell 70 is located at an intersection of local word line 71 and a bit line pair comprising a bit line 72 providing a signal labelled "BL" thereon, and a bit line 73 providing a signal labelled "$\overline{BL}$" thereon. Bit lines 72 and 73 are coupled to column decoder 62. Column decoder 62 also receives a signal labelled "WLOC" and BS. WLOC is a signal of a group of signals labelled "WLOC0-WLOC7", not shown in FIG. 3, corresponding to the column address of memory cells on bit lines 72 and 73; it is designated generically to emphasize this fact. Coupled to bit lines 72 and 73 is bit line load 74, which receives as inputs EQBIAS, EQLOC, and WLOC. Control circuit 64 receives signals EQBIAS and CPW to provide signals EQLOC and WLOC. CPW is a signal of the group CPW0-CPW7, received by memory block 50, corresponding to the column address of memory cells on bit lines 72 and 73; it is designated generically to emphasize this fact. Other control circuits receive other corresponding predecoded column signals of the group CPW0-CPW7. Column decoder 62 receives eight signals CPR0-CPR7 and couples to each bit line pair in memory array 66, and couples to eight read global data line pairs (not all shown in FIG. 3). Shown in FIG. 3 is a read global data line pair comprising a first read global data line 80 providing RGDL0 thereon, and a second read global data line 81 providing $\overline{RGDL0}$ thereon, coupled to the output of column decoder 62; and a write global data line pair comprising a first write global data line 82 providing WGDL0 thereon, and a second write global data line 83 providing $\overline{WGDL0}$ thereon, coupled to an input of column decoder 62.

In operation, memory block 50 is selected by the assertion of predecoded signals $\overline{A8}$ and BP13. When A8 and BP13 are asserted, local word line driver 60 asserts signal BS to activate selected bit line loads and to activate column decoding performed by column decoder 62. When memory block 50 is selected, local word line driver block 60 provides one of 256 word lines in response to RS0-RS63 and eight additional predecoded block signals BP0-BP7. In the read cycle, if memory block 50 is selected and local word line driver block 60 asserts local word line 71, then memory cell 70 couples a data bit stored therein differentially onto bit lines 72 and 73. Bit line load 74 provides an active pull up on bit lines 72 and 73. If a binary 1 is stored in memory cell 70, then a positive differential voltage is developed between BL and $\overline{BL}$. If a binary 0 is stored in memory cell 70, then a negative differential voltage is developed between BL and $\overline{BL}$. In either case, transistors in memory cell 70 have gate sizes sufficiently large to reduce a voltage provided by bit line load 74 enough so that a differential voltage may be recognized by column decoder 62. Column decoder 62 then decodes one pair of bit lines for each read global data line pair. Each selected bit line pair is coupled to a corresponding read global data line pair, and information stored in the corresponding selected memory cell is sensed and provided as a differential current onto the corresponding read global data line.

In the write cycle, data is provided differentially from eight write global data line pairs to corresponding selected memory cells. While the decoding occurs as in the read cycle, data is received by column decoder 62 during the *write cycle* from write global data lines 82 and 83 providing signals WGDL0 and $\overline{WGDL0}$ thereon. A principal difference between the read cycle and the write cycle is that during the read cycle a small differential voltage is developed on the bit line pair, but during the write cycle a large differential voltage is developed on the bit line pair by column decoder 62. While the voltage developed on the bit line pair during the write cycle must be large enough to overwrite a bit stored in a corresponding memory cell, the bit line load must precharge and equalize the voltage on the bit lines sufficiently after a write cycle to avoid disturbing a following read cycle.

Figure 4:
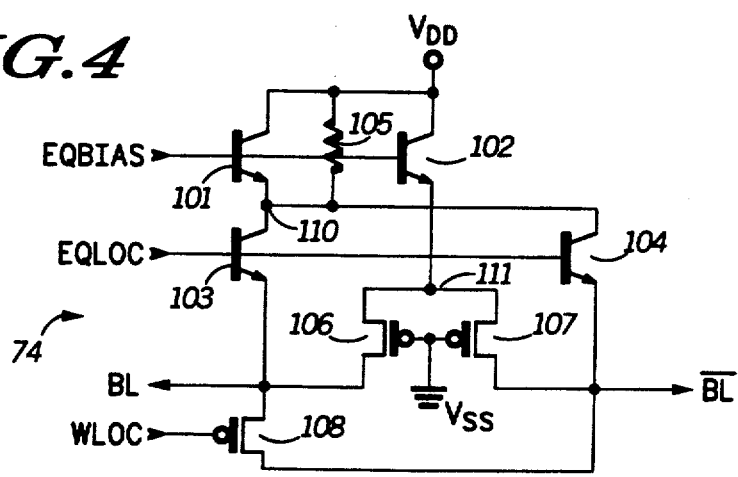
FIG. 4 illustrates in schematic form a bit line load and common voltage driver circuit shown in the memory block of FIG. 3.

FIG. 4 illustrates in schematic form bit line load 74 for use in memory 30, and NPN transistors 101 and 102 and resistor 105 used to bias bit line load 74. Bit line load 74 comprises NPN transistors 103, and 104; a resistor 105; and P-channel transistors 106, 107, and 108. Transistor 101 has a collector connected to $V_{DD}$, a base for receiving signal EQBIAS, and an emitter connected to a node 110. Transistor 102 has a collector connected to $V_{DD}$, a base for receiving signal EQBIAS, and an emitter connected to a node 111. Transistor 103 has a collector connected to node 110, a base for receiving signal EQLOC, and an emitter connected to bit line 72. Transistor 104 has a collector connected to node 110, a base for receiving signal EQLOC, and an emitter connected to bit line 73. Resistor 105 has a first terminal connected to $V_{DD}$, and a second terminal connected to node 110. Transistor 106 has a source connected to node 111, a gate connected to $V_{SS}$, and a drain connected to bit line 72. Transistor 107 has a source connected to node 111, a gate connected to $V_{SS}$, and a drain connected to bit line 73. Transistor 108 has a first current electrode connected to bit line 72, a gate for receiving signal WLOC, and a second current electrode connected to bit line 73. Which current electrode of transistor 108 functions as a source and which current electrode functions as a drain depends on the respective voltages on bit lines 72 and 73.

In basic operation, bit line load 74 serves two functions. First, bit line load 74 provides an active pull-up on both bit lines 72 and 73 for proper development of voltages BL and $\overline{BL}$ during the read cycle. During the read cycle, transistors 103 and 104 provide voltages on bit lines 72 and 73 in response to a differential current therefrom. In addition, transistors 106 and 107, which are always conductive, weakly pull up bit lines 72 and 73. Transistor 108 is also conductive during the read cycle to limit a differential voltage to a small amount, the small amount being just large enough to sense. Second, bit line load 74 equalizes and precharges the voltages on bit lines 72 and 73 during the write recovery period. Write recovery occurs during the transition from a write cycle to a read cycle. The precharging is accomplished by transistors 103 and 104 providing predetermined voltages on bit lines 72 and 73, and the equalization is accomplished by transistor 108 coupling together bit lines 72 and 73. The action of transistors 103, 104, and 108 ensures that voltages on bit lines 72 and 73 are substantially equal at the end of the write recovery period. Bit line load 74 provides an improvement over bit line load 20 of FIG. 1 because a worst-case reverse bias on bipolar transistors 103 and 104 is limited to a predetermined voltage, the predetermined voltage ensuring an acceptable mean life for the transistors under worst case conditions.

Specifically, transistor 101 provides a voltage on node 110 at one base-to-emitter diode voltage drop ($V_{BE}$) below the voltage on the signal EQBIAS, or (EQBIAS$-V_{BE}$). Similarly, transistor 102 provides a voltage on node 110 at a voltage equal to (EQBIAS$-V_{BE}$). Note that base-to-emitter diode voltage drop $V_{BE}$ is assumed to be equal for all transistors. In reality, bipolar transistor emitter size determines in part the $V_{BE}$ of a transistor; however, minor variations in $V_{BE}$ of the various transistors does not affect the invention. EQBIAS is set somewhat less than $V_{DD}$, and are made substantially independent of fluctuations in $V_{DD}$. If $V_{DD}$ is approximately 5 volts, EQBIAS may be set to approximately 4.2 volts. If the $V_{BE}$ of transistor 101 is 0.7 volts, then the voltage on node 110 is equal to approximately 3.5 volts.

During the write recovery period, transistors 103 and 104 increase the voltage on bit lines 72 and 73 to (EQLOC$-V_{BE}$). Signal EQLOC is provided at approximately EQBIAS during the read cycle. EQLOC is negated at a logic low of approximately two $V_{BE}$s above $V_{SS}$, about 1.4 volts, when a corresponding memory block is selected during the write cycle, and is asserted at a logic high of approximately EQBIAS, at about 4.2 volts, otherwise. The maximum reverse bias voltage ($V_{RBMAX}$) on transistors 103 and 104 occurs during a write cycle:

$$V_{RBMAX} = BL(HIGH) - EQLOC(LOW) \qquad (2)$$

or approximately $3.5 - 1.4 = 2.1$ volts. If $V_{BE}$ is equal to 0.7 volts and $V_{SS}$ is equal to 0 volts, $V_{RBMAX}$ would equal approximately 2.1 volts, which is significantly less than that of prior art bit line load 20 of FIG. 1.

The voltage supplied by transistor 101 and resistor 105 on node 110 may be shared between several bit line loads; similarly the voltage provided by transistor 102 on node 111 may be shared between several bit line loads. Thus, bit line load 74 is an equivalent representation of the bit line load circuit and does not represent all components unique to each bit line load. In the preferred embodiment, node 110 is shared by 64 bit line loads; the voltage on node 110 is provided by eight identical circuits within block 50 each having components corresponding to transistor 101 and resistor 105. The voltage on node 111 is shared between all sixteen memory blocks 40-55 of FIG. 2, with each memory block providing an identical circuit, the circuit comprising a transistor corresponding to transistor 102 having an emitter connected to node 111.

The combination of transistor 101 and resistor 105 to provide the voltage on node 110 has certain desired effects for the prevention of self-boosting. Self-boosting occurs when the voltage on the base of a bipolar transistor increases rapidly, where the emitter is coupled to a highly capacitive load. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boots the level of the base as the voltage at the emitter rises. Self-boosting can be stopped by reducing the charge on the base. One way to reduce the charge on the base is to cause the transistor to go into saturation, by forward biasing the base-collector diode. Transistor 101 and resistor 105 decrease the effect of self-boosting on the bases of transistors 103 and 104 by decreasing the voltage on the collectors of transistors 103 and 104 when a large collector current flows (during write recovery). Resistor 105 causes the voltage on node 110 to be at $V_{DD}$ when substantially no current flows, which occurs when EQLOC is at a logic low. In actuality a small reverse saturation current flows but if resistor 105 is sized correctly this current can be ignored. When EQLOC switches to a logic high, either transistor 103 or 104 becomes initially active because its base-emitter junction is forward biased into a bit line at a low voltage, and its base-collector junction is reverse biased. A collector current is provided flowing into node 110. With an appreciable current, the voltage on node 110 begins to drop due to the IR drop in resistor 105. However, transistor 101 keeps the voltage on node 110 from dropping below (EQBIAS $-V_{BE}$). When the base voltage of transistor 103 or transistor 104 rises by one diode voltage drop above (EQBIAS $-V_{BE}$) the excess base charge is discharged through the base-collector diode, and self-boosting is stopped. As the collector current of transistor 103 decreases, resistor 105 increases the voltage on the collector of transistor 103 to bring transistor 103 out of saturation.

Referring again to FIG. 3, two sources of reverse bias on base-to-emitter junctions of transistors 103 and 104 of FIG. 4 may be identified. First, as previously discussed, a reverse bias may be formed during a write cycle. The voltage on bit lines 72 and 73 is (EQLOC $-V_{BE}$) when precharging is complete. During a write cycle, EQLOC is provided as a logic low voltage. Thus, a difference between a logic high voltage and a logic low voltage on EQLOC must be limited to a predetermined number to assure an acceptable transistor life under worst case conditions. Second, during the write cycle, data input buffer 39 of FIG. 2 provides a data bit to be stored differentially onto a write global data line pair. Column decoder 62 then uses predecoded column signals WLOC0-WLOC7 to couple the write global data line pairs to selected bit line pairs. To ensure that the worst case base-to-emitter reverse bias is less than the predetermined number established by EQLOC, data input buffer 39 of FIG. 2 *limits a logic* high voltage on a write global data line, for example WGDL0 or $\overline{\text{WGDL0}}$, to (EQLOC $-V_{BE}$). Note that column decoder 62 may decrease this voltage slightly when coupling the write global data lines to the bit line pairs.

Figure 5:
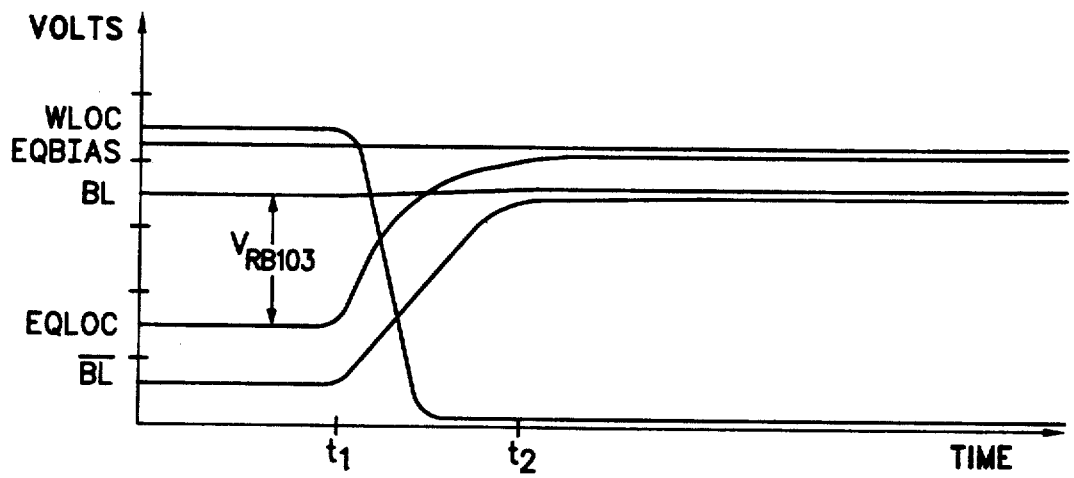
FIG. 5 illustrates a timing diagram of signals pertinent to FIG. 4.

Typical waveforms of control signals EQLOC and WLOC and other pertinent signals are shown in FIG. 5. The signals represented are WLOC, EQBIAS, BL, $\overline{\text{BL}}$, and EQLOC. FIG. 5 shows the variation in voltage of each of the pertinent signals with respect to time. A point in time labelled "t1" along the horizontal axis represents approximately a time division between a write cycle and a read cycle. Before time t1, the write cycle is in progress; between t1 and a time labelled "t2" is the write recovery period. EQBIAS is constant at approximately 4.2 volts. During the write cycle, a voltage is developed between BL and $\overline{\text{BL}}$. As previously noted, the voltage on BL and $\overline{\text{BL}}$ is provided by data input buffer 39 of FIG. 2 onto write global data lines which are coupled to column decoder 62 of FIG. 3 to selected bit line pairs. In the illustrated example a binary 1 is being provided as a positive differential voltage between BL and $\overline{\text{BL}}$. BL is at approximately 3.5 volts, while $\overline{\text{BL}}$ is approximately one $V_{BE}$ above $V_{SS}$, or about 0.7 volts. Therefore, there is a differential voltage of about 2.8 volts which is sufficient to ensure a fast transfer of data when the contents of a selected memory cell are overwritten during the write cycle. EQLOC is at ($V_{SS}+2 V_{BE}$), or about 1.4 volts. When the write recovery period begins, EQLOC begins to rise at t1. As EQLOC rises, $\overline{\text{BL}}$ also rises. At the same time, WLOC is negated, which makes transistor 108 of FIG. 4 conductive, coupling bit lines 72 and 73 together. The voltage on $\overline{\text{BL}}$ rises until, at a time labelled "t2", it approximately equals the voltage on BL. The maximum reverse bias, labelled "$V_{RB103}$", occurs in this case on transistor 103. In the illustrated embodiment, $V_{RB103}$ is $3.5-1.4=2.1$ volts. $V_{RB103}$ is therefore much less than the $V_{RBMAX}$ of 4.3 volts associated with prior art bit line load 20 of FIG. 1. The logic high and logic low voltages chosen for EQLOC, the source voltages of transistors 106 and 107 (shown in FIG. 4), and the voltages provided by data input buffer 39 (shown in FIG. 2) which are eventually coupled to corresponding bit lines, assure a worst case reverse bias of approximately 2.1 volts to guarantee a mean transistor lifetime of at least 10 years under worst case conditions. The logic high and logic low voltages for EQLOC also assure a fast transfer of data during the write cycle. The worst case conditions occur when a given memory cell is continually written to, at maximum specified voltage for $V_{DD}$, and at minimum specified temperature. Note that other transistor lifetimes may be assured by choosing smaller worst-case reverse-bias voltages.

Figure 6:
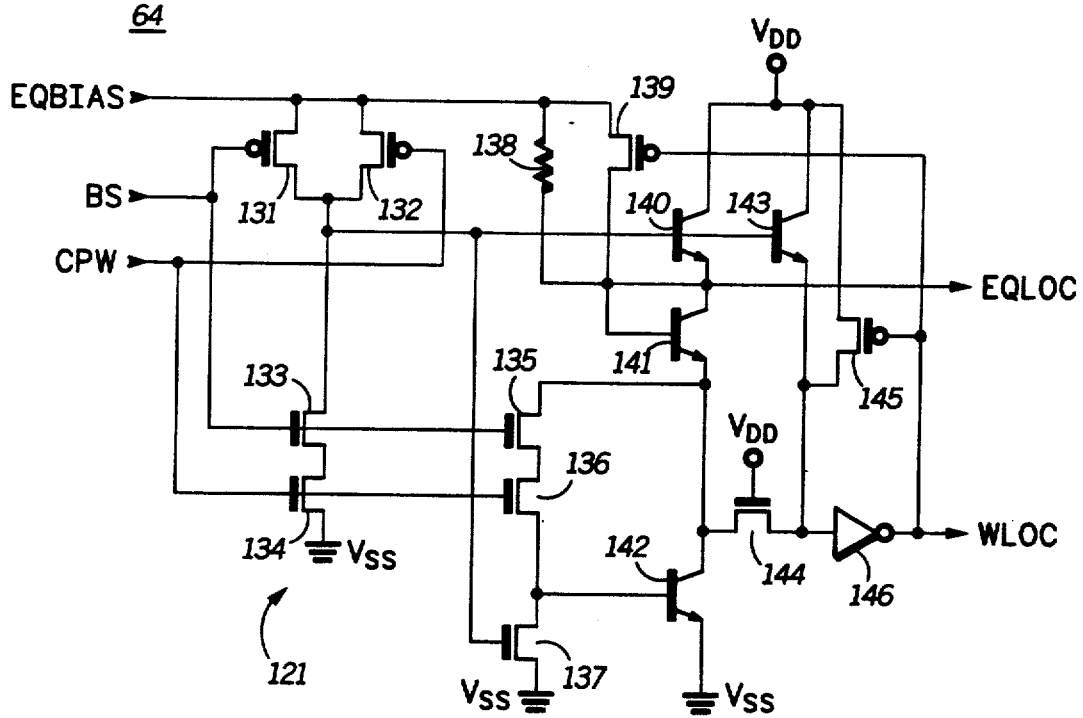
FIG. 6 illustrates in partial schematic form the bit line load control circuit of FIG. 3 for use with the bit line load of FIG. 4.

FIG. 6 illustrates in partial schematic form control signal generator circuit 64 for use with the bit line load of FIG. 4. Circuit 64 comprises a NAND gate 121, N-channel transistors 135, 136, and 137, a resistor 138, a P-channel transistor 139, NPN transistors 140, 141, 142, and 143, and N-channel transistor 144, a P-channel transistor 145, and an inverter 146. NAND gate 121 comprises P-channel transistors 131 and 132, and N-channel transistors 133 and 134.

Transistor 131 has a source connected to EQBIAS, a gate for receiving signal BS, and a drain providing an output terminal of NAND gate 121. Transistor 132 has a source connected to EQBIAS, a gate for receiving signal labelled "CPW", and a drain connected to the drain of transistor 131. Transistor 133 has a drain connected to the drain of transistor 131, a gate for receiving signal BS, and a source. Transistor 132 has a drain connected to the source of transistor 133, a gate for receiving signal CPW, and a source connected to $V_{SS}$. Transistor 135 has a drain, a gate for receiving signal BS, and a source. Transistor 136 has a drain connected to the source of transistor 135, a gate for receiving signal CPW, and a source. Transistor 137 has a drain connected to the source of transistor 136, a gate connected to the drain of transistor 131, and a source connected to $V_{SS}$. Resistor 138 has a first terminal connected to EQBIAS, and a second terminal for providing EQLOC. Transistor 139 has a source connected to EQBIAS, a gate for receiving signal WLOC, and a drain connected to the second terminal of resistor 138. Transistor 140 has a collector connected to $V_{DD}$, a base connected to the drain of transistor 131, and an emitter connected to the second terminal of resistor 138 and the drain of transistor 139. Transistor 141 has a collector connected to the emitter of transistor 140, a base connected to the second terminal of resistor 138 and to the drain of transistor 139, and an emitter connected to the drain of transistor 135. Transistor 142 has a collector connected to the emitter of transistor 141, a base connected to the drain of transistor 137, and an emitter connected to $V_{SS}$. Transistor 143 has a collector connected to $V_{DD}$, a base connected to the drain of transistor 131, and an emitter.

Transistor 144 has a first current electrode connected to the emitter of transistor 141, a gate connected to $V_{DD}$, and a second current electrode connected to the emitter of transistor 143. Transistor 145 has a source connected to $V_{DD}$, a gate for receiving signal WLOC, and a drain connected to the emitter of transistor 143. Inverter 146 has an input terminal connected to the emitter of transistor 143, and an output terminal for providing signal WLOC.

Circuit 64 may be understood first by the logical relation established between the input signals, and then by the way the components shown in FIG. 6 perform the functions. BS is a signal asserted at a logic high when a block in which a corresponding bit line pair is located is enabled. CPW is a signal asserted at a logic high when a write to the corresponding bit line pairs occurs, and corresponds to one signal of the group CPW0–CPW7. EQLOC, provided on the emitter of transistor 140, is a logical NAND between signals BS and CPW. WLOC, on the other hand, is provided as an inverse of the logical NAND between CPW and BS; in other words, as a logical AND between BS and CPW. While WLOC is provided at CMOS levels, with a logic high of approximately $V_{DD}$ and a logic low of approximately $V_{SS}$, EQLOC is provided with a logic high of approximately EQBIAS, and a logic low of approximately $V_{SS}+2V_{BE}$. As described earlier, limitation of the logic low voltage of EQLOC improves the mean lifetime of transistors 103 and 104 of FIG. 4.

The output terminal of NAND gate 121 is provided by the drain of transistor 131. When the output terminal of NAND gate 121 is a logic high, the base-emitter junction of transistor 140 becomes forward biased to provide EQLOC as a logic high. When the output of NAND gate 121 is a logic high, either transistor 131 or transistor 132, or both, is conductive. Since both transistors 131 and 132 are P-channel transistors connected to voltage EQBIAS, at approximately 4.2 volts, a logic low voltage on the gates makes the transistors conductive. A drain-to-source voltage $V_{DS}$ of each transistor is approximately zero volts, and the voltage on the output terminal of NAND gate 121 is approximately at EQBIAS. Therefore, the logic high voltage of EQLOC is approximately EQBIAS. On the other hand, (EQBIAS$-V_{BE}$) appears on the input terminal of inverter 146 and is latched to $V_{DD}$ by transistor 145. This voltage is recognized as a logic high by inverter 146, and the output terminal of inverter 136 is driven to a logic low. Transistor 139 is placed into saturation, increasing EQLOC to EQBIAS. In essence, then, inverter 146 and transistor 139 form a weak latch to increase EQLOC to EQBIAS once EQLOC crosses from a logic low to a logic high. Transistor 137 is made conductive by the output of NAND gate 121, and couples the base of transistor 142 to $V_{SS}$, keeping the base-emitter junction of transistor 142 from becoming forward biased, and therefore keeping any current from flowing into the collector of transistor 141 or 142.

When the output terminal of NAND gate 121 is a logic low, caused by both BS and CPW being a logic high, EQLOC is provided at approximately ($V_{SS}+2V_{BE}$). The base-emitter junction of transistor 140 becomes reverse biased, and transistor 139 becomes nonconductive. Transistors 135 and 136 both become conductive and couple the collector of transistor 142 to the base of transistor 142. Transistor 137 becomes nonconductive. Therefore, EQLOC is connected to $V_{SS}$ through two diode-connected transistors 141 and 142. Resistor 138 provides the bias current to keep the base-to-emitter diodes of transistors 141 and 142 forward biased.

With regard to WLOC, when the output of NAND gate 121 is a logic high, the voltage on the input terminal of inverter 146 is a logic high, and the output terminal of inverter 146 is a logic low. Transistor 145 then becomes conductive to provide a weak latch when the voltage at the input terminal of inverter 146 crosses from a logic low to logic high. When the output of NAND gate 121 switches to a logic low, transistor 143 becomes nonconductive. The high voltage developed on the input terminal of inverter 146 then causes transistor 144 to be conductive and to discharge the voltage on the input terminal of inverter 146 through transistor 142 to $V_{SS}$, until it passes below the switchpoint of inverter 146. It should be remembered that circuit 64 is but one embodiment for providing the waveforms shown in FIG. 5, and that other circuits are possible.

Figure 7:
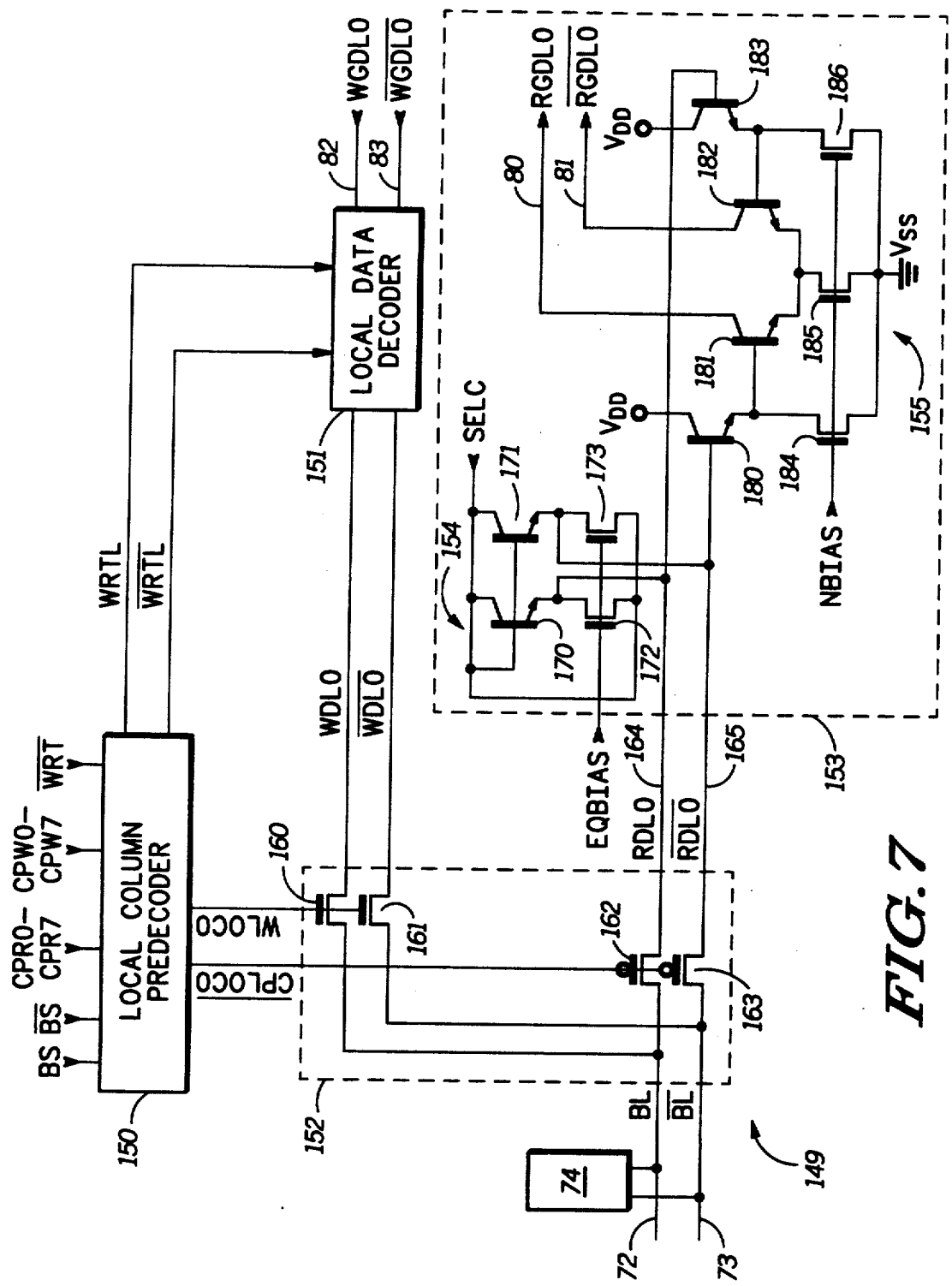
FIG. 7 illustrates in partial schematic and partial block form a portion of the column decoder of FIG. 3 including a sense circuit in accordance with the present invention.

FIG. 7 illustrates in partial schematic form and partial block form a portion 149 of column decoder 62 of FIG. 3 including a sense circuit 153 in accordance with the present invention. FIG. 7 generally shows bit lines 72 and 73 and bit line load 74 of FIG. 3, a local column predecoder 150, a local data decoder 151, a bit line column decoder 152, data line load 154, and sense amplifier 155. More particularly, bit line column decoder 152 comprises N-channel transistors 160 and 161, and P-channel transistors 162 and 163. Sense circuit 153 comprises a data line load 154 and a sense amplifier 155. Data line load 154 comprises NPN transistors 170 and 171, and N-channel transistors 172 and 173. Sense amplifier 155 comprises NPN transistors 180, 181, 182, and 183, and N-channel transistors 184, 185, and 186.

As in FIG. 3, and more particularly illustrated in FIG. 4, FIG. 7 also shows bit line load 74 coupled to bit lines 72 and 73. Local column predecoder 150 receives block select signal BS, a complement of signal BS labelled "$\overline{BS}$", predecoded column signals CPR0–CPR7, predecoded column signals CPW0–CPW7, and write signal $\overline{WRT}$. In response local column predecoded 150 provides a read predecoded signal labelled "CPLOC0", a write predecoded signal labelled "WLOC0", and true and complement local write signals labelled respectively "WRTL" and "$\overline{WRTL}$". Local data decoder 151 receives write global data line signals WGDL0 and $\overline{WGDL0}$, and local write signals WRTL and $\overline{WRTL}$, and provides write data line signals labelled "WDL0" and "$\overline{WDL0}$" in response. In bit line column decoder 152, transistor 160 has a drain for receiving WDL0, a gate for receiving signal WLOC0, and a source connected to bit line 72. Note that the designation of source and drain is arbitrary since at different times either current electrode may be at a positive potential with respect to the other current electrode. Transistor 161 has a drain for receiving signal $\overline{WDL0}$, a gate for receiving signal WLOC0, and a source connected to bit line 73. Transistor 162 has a source connected to bit line 72, a gate for receiving signal CPLOC0, and a drain for providing a signal labelled "RDL0" on a read data line 164. Transistor 163 has a source connected to bit line 73, a gate for receiving signal CPLOC0, and a drain for providing a signal labelled "$\overline{RDL0}$" on a read data line 165.

In read data line load 154, transistor 170 has a collector for receiving a select signal labelled "SELC", a base for receiving signal SELC, and an emitter coupled to read data line 164. Transistor 171 has a collector for receiving signal SELC, a base for receiving signal SELC, and an emitter coupled to read data line 165. Transistor 172 has a drain for receiving signal SELC, a gate for receiving signal EQBIAS, and a source connected to the emitter of transistor 170 and to read data line 164. Transistor 173 has a drain for receiving signal SELC, a gate for receiving signal EQBIAS, and a source connected to the emitter of transistor 171 and to read data line 165. In sense amplifier 155, transistor 180 has a collector connected to $V_{DD}$, a base connected to read data line 165 for receiving signal RDL0 thereon, and an emitter. Transistor 181 has a collector coupled to a read global data line 80 for providing signal RGDL0 thereon, a base connected to the emitter of transistor 180, and an emitter. Transistor 182 has a collector coupled to a read global data line 81 for providing signal RGDL0 thereon, a base, and an emitter connected to the emitter of transistor 181. Transistor 183 has a collector connected to $V_{DD}$, a base coupled to read data line 164 for receiving signal RDL0, and an emitter connected to the base of transistor 182. Transistor 184 has a drain connected to the emitter of transistor 180, a gate for receiving a bias signal labelled "NBIAS", and a source connected to $V_{SS}$. Transistor 185 has a drain connected to the emitters of transistors 181 and 182, a gate for receiving NBIAS, and a source connected to $V_{SS}$. Transistor 186 has a drain connected to the emitter of transistor 183, a gate for receiving NBIAS, and a source connected to $V_{SS}$.

In operation, portion 149 of column decoder 62 of FIG. 3 illustrated in FIG. 7 performs column decoding for read and write cycles, and data sensing during read cycles. In response to a write cycle to the corresponding memory block, indicated when both BS and $\overline{WRT}$ are asserted, local column predecoder 150 asserts WRTL and $\overline{WRTL}$. In response, local data decoder 151 couples write global data line signals WGDL0 and $\overline{WGDL0}$ respectively to WDL0 and $\overline{WDL0}$. Local column predecoder 150 provides eight predecoded signals, WLOC0 and seven others not shown in FIG. 7, to couple WDL0 and $\overline{WDL0}$ to one of eight bit line pairs. WLOC0 is an active-high signal which makes transistors 160 and 161 conductive to couple signals WDL0 and $\overline{WDL0}$ to bit lines 72 and 73 when asserted. WLOC0 is asserted in response to CPW0–CPW7 during the write cycle.

When the corresponding memory block is selected during the read cycle, local column predecoder 150 provides eight predecoded signals, CPLOC0 and seven others not shown in FIG. 7, to couple one of eight bit line pairs to a corresponding read data line pair in response to CPR0–CPR7. CPLOC0 is an active-low signal which makes transistors 162 and 163 conductive to couple bit lines 72 and 73 respectively to read data lines 164 and 165 when asserted. Seven other pairs of bit lines not shown are selectively coupled to read data lines 164 and 165 through P-channel transistors like transistors 162 and 163. A one-of-eight decode occurs on the eight bit line pairs to provide the one data line signal pair RDL0 and $\overline{RDL0}$ respectively on read data lines 164 and 165.

Read data line load 154 couples read data lines 164 and 165 to a logic low voltage of approximately $V_{SS}$ during the write cycle or when the corresponding memory block is not selected. When a read cycle to the corresponding memory block begins SELC is asserted at a logic high of $(EQBIAS-V_{BE})$. Bipolar transistors 170 and 171 quickly couple read data lines 164 and 165 to a predetermined voltage, the predetermined voltage equal to the select signal minus a $V_{BE}$ of transistor 170 or 171, or $(SELC-V_{BE})$. When the voltage on read data lines 164 and 165 exceeds $(SELC-V_{BE})$, the base-emitter junctions of bipolar transistors 170 and 171 are no longer forward biased and bipolar transistors 170 and 171 become inactive. Transistors 172 and 173 also become inactive when the voltage on the respective sources rise above EQBIAS minus a respective threshold voltage $(V_T)$. Thereafter, the voltage on bit lines 72 and 73 continues to increase the voltage on read data lines 164 and 165, through transistors 162 and 163, until the voltage reaches approximately $(EQBIAS-V_{BE})$, as illustrated earlier in the discussion of FIGS. 4 and 5. After read data line load 154 becomes inactive, a differential voltage between read data lines 164 and 165 is determined by the contents of the selected memory cell. As described earlier in the discussion of FIGS. 4 and 5, the voltages provided on bit lines 72 and 73 are approximately $(EQBIAS-V_{BE})$, as determined by bit line load 74. Since the logic high of signal SELC is also approximately $(EQBIAS-V_{BE})$, the voltages of the bit lines and the read data lines are approximately equal.

The predetermined voltage provided on RDL0 and $\overline{RDL0}$ by read data line load 154 quickly enables sense amplifier 155. When the voltage on RDL0 and $\overline{RDL0}$ is at a logic low of SELC, approximately $V_{SS}$, amplifier 155 is disabled. However, in response to the start of the read cycle, sense amplifier 155 is enabled and senses a differential voltage between bit lines 72 and 73 determined by the bit stored in the selected memory cell. The differential voltage sensed by sense amplifier 155 is provided as a differential current on global data lines 80 and 81. Then, as previously illustrated in FIG. 2, read global data line loads 37 converts the differential current into a differential voltage for eventual output as signal group DATA.

More particularly, sense amplifier 155 is enabled when the voltage on either read data line 164 or 165 exceeds a predetermined voltage of approximately $(V_{SS}+2V_{BE})$. When the corresponding memory block is not selected during the read cycle, SELC is negated and transistors 172 and 173 are conductive, coupling data lines 172 and 173 to SELC at approximately $V_{SS}$. Since transistors 180 and 181 are emitter followers, the voltage on the emitter of transistor 181 follows the voltage on the base of transistor 180 but at $2V_{BE}$ below. As the voltage on read data line 165 drops toward $V_{SS}$, the voltage on the emitter of transistor 181 drops. When the voltage on the base of transistor 181 reaches zero, transistor 181 is no longer in the active region. Hence substantially no current is drawn from read global data line 81. Similarly, because the voltage on read data line 164 also approaches the logic low voltage of approximately $V_{SS}$, transistor 182 is no longer in the active region and substantially no current is drawn from read global data line 80. Hence, when SELC is negated, sense amplifier 155 is disabled.

When SELC is asserted, the voltages on the emitters of transistors 170 and 171 rise to approximately $(SELC-V_{BE})$, which is equal to $(EQBIAS-2V_{BE})$, before eventually rising to SELC. The voltages on the emitters of transistors 180 and 183 follow the voltages on read data lines 165 and 164, respectively, minus one $V_{BE}$. The selected memory cell provides a differential signal between BL and $\overline{BL}$, which is reflected as a differential voltage between the voltage on the bases of transistor 182 and 181. The voltage difference causes transistors 182 and 181 to be more or less conductive with respect to each other, and hence to selectively divert the current sourced by transistor 185 in response to the voltage difference. NBIAS is a voltage which is generated on-chip and which biases N-channel MOS transistors to function as current sources. Transistors 182 and 181 are in the active region, and a small difference in voltage is reflected in a large difference in output current on read global data lines 80 and 81. Sense amplifier 155 is thus a transconductance amplifier, converting a differential voltage into a differential current. Subsequently, read global data line loads 37 of FIG. 2 convert the differential current provided on read global data lines 80 and 81 into a differential voltage for final sensing and outputting. Read data line load 154 couples read data lines 164 and 165 to a voltage high enough to enable sense amplifier 155 through bipolar transistors 170 and 171, which switch faster than corresponding MOS transistors. Then read data line load 154 becomes inactive. Thus, sense circuit 153 improves the speed of the sensing function over the speed which could be accomplished with a MOS design, while keeping power consumption to a minimum.

Figure 8:
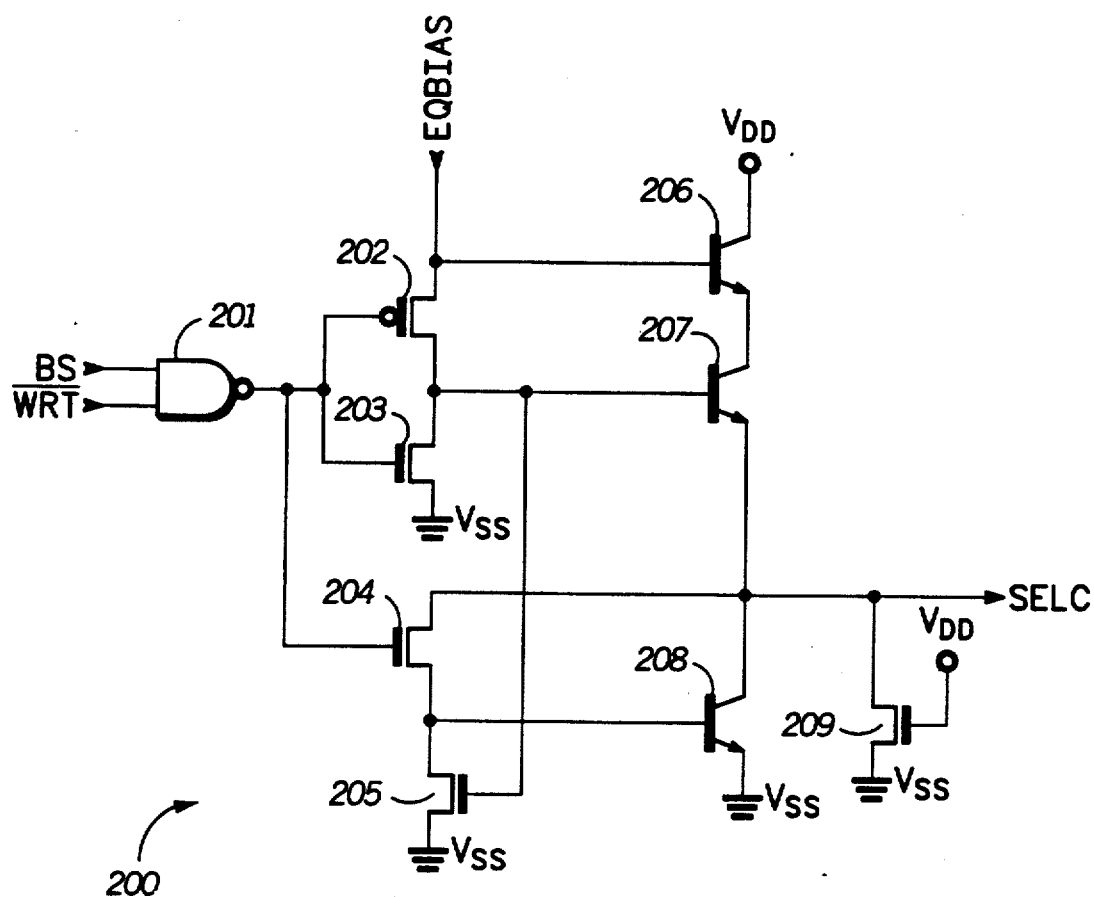
FIG. 8 illustrates in partial schematic form a control circuit used to generate a control signal for the data line load of FIG. 7.

FIG. 8 illustrates in partial schematic form a control circuit 200 used to generate a control signal for data line load 154 of FIG. 7. Control circuit 200 is one circuit which can be used to generate signal SELC with the proper logic levels and with the proper relation to signals BS and $\overline{WRT}$, but others may also be used. Control circuit 200 comprises a NAND gate 201, a P-channel transistor 202, N-channel transistors 203, 204, and 205, NPN transistors 206, 207, and 208, and an N-channel transistor 209. NAND gate 201 has a first input terminal for receiving signal BS, a second input terminal for receiving signal $\overline{WRT}$, and an output terminal. Transistor 202 has a source for receiving signal EQBIAS, a gate connected to the output terminal of NAND gate 201, and a drain. Transistor 203 has a drain connected to the drain of transistor 202, a gate connected to the output terminal of NAND gate 201, and a source connected to $V_{SS}$. Transistor 204 has a drain, a gate connected to the output terminal of NAND gate 201, and a source. Transistor 205 has a drain connected to the source of transistor 204, a gate connected to the drain of transistor 202, and a source connected to $V_{SS}$. Transistor 206 has a collector connected to $V_{SS}$, a base for receiving signal EQBIAS, and an emitter. Transistor 207 has a collector connected to the emitter of transistor 206, a base connected to the drain of transistor 202, and an emitter for providing signal SELC. Transistor 208 has a collector connected to the emitter of transistor 207 and to the drain of transistor 204, a base connected to the source of transistor 204, and an emitter connected to $V_{SS}$. Transistor 209 has a drain connected to the emitter of transistor 207, a gate connected to $V_{DD}$, and a source connected to $V_{SS}$.

In operation, control circuit 200 provides signal SELC at a logic high in response to signal BS being asserted and $\overline{WRT}$ being negated, or in other words, when a corresponding memory block is selected during a read cycle. In that case, the output of NAND gate 201 is a logic low. Transistors 202 and 203 logically function as an inverter, and the voltage on the drain of transistor 202 is a logic high of approximately EQBIAS. Transistor 204 is nonconductive, and transistor 205 is conductive, coupling the base of transistor 208 to $V_{SS}$ to prevent it from being conductive. At the same time, transistor 207 is made conductive by the application of approximately EQBIAS to the base. The voltage of SELC then is one base-to-emitter diode voltage drop below the voltage of the base, or approximately (EQBIAS $-V_{BE}$). The emitter of transistor 206 is coupled to the collector of transistor 207 to provided a voltage less than either $V_{DD}$ or EQBIAS. The emitter of transistor 206 is set at a voltage of (EQBIAS $-V_{BE}$). When the voltage on the base of transistor 207 is a logic high at approximately EQBIAS, the reduced voltage on the collector of transistor 207 makes transistor 207 begin to saturate as the voltage on the base approaches EQBIAS, to prevent self-boosting of the base of transistor 207. When the corresponding memory block is not selected or a write cycle is in progress (BS or $\overline{WRT}$ at a logic low), the output of NAND gate 201 is at a logic high, making transistor 204 conductive, which couples together the collector and the emitter of transistor 204 to provide SELC at a logic low. The voltage on the drain of transistor 202 is a logic low, and transistor 207 is nonconductive. Transistor 209, which is always conductive, is provided as a weak pulldown to SELC to decrease the voltage on SELC to $V_{SS}$ when SELC is provided as a logic low. Using typical values, SELC has a logic high voltage of approximately (EQBIAS $-V_{BE}$), or 3.5 volts, and a logic low voltage of approximately $V_{SS}$, or 0 volts. The predetermined voltage at which point sense amplifier 155 becomes active is equal to approximately ($V_{SS}+2V_{BE}$), or about 1.4 volts.

Figure 9:
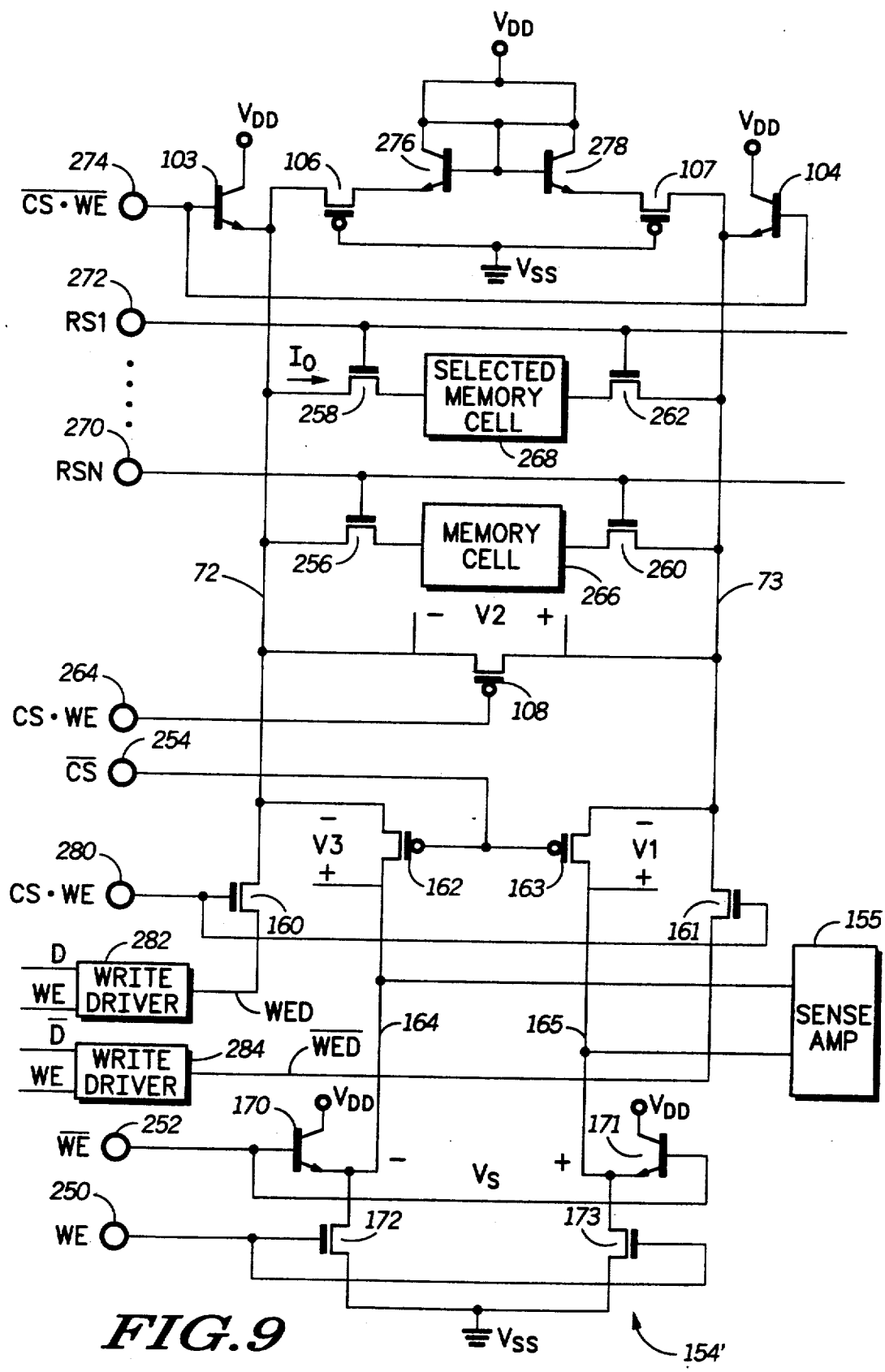
FIG. 9 is a partial schematic diagram of an additional embodiment to be used in a column sense scheme for providing a voltage during a read cycle that is substantially independent of non-tracking process variations.

FIG. 9 shows an additional embodiment that is structurally similar to the circuit shown in FIG. 7, but reveals a column system that does not require the same support circuitry shown in FIGS. 1-3 and 6. It should be understood that components similar to those of FIGS. 2-7 are designated by the same reference numerals.

Referring to FIG. 9, a partial schematic diagram of an additional embodiment to be used in a column sense scheme for providing a voltage during a read cycle that is substantially independent of non-tracking process variations is shown comprising transistors 172 and 173 having their drain electrodes coupled to the emitters of transistors 170 and 171, respectively. It is worth noting that transistors 170-173 comprise read data line load 154' whereby the differences between read data line load 154 of FIG. 7 and read data line load 154' of FIG. 9 will be highlighted hereinafter. The gate electrodes of transistors 172 and 173 are coupled to terminal 250 at which signal WE is applied. Further, the source electrodes of transistors 172 and 173 are coupled to a first supply voltage terminal at which the operating potential $V_{SS}$ is applied. The collectors of transistors 170 and 171 are coupled to a second supply voltage terminal at which the operating potential $V_{DD}$ is applied. The bases of transistors 170 and 171 are coupled to terminal 252 at which signal $\overline{WE}$ is applied. Further, the emitter of transistor 170 is coupled to the source electrode of P-channel field effect transistor (FET) 162 via first read data line 164, while the emitter of transistor 171 is coupled to the source electrode of P-channel FET 163 via read data line 165. Also, the emitters of transistors 170 and 171 are respectively coupled to first and second inputs of sense amp 155. The gate electrodes of FETs 162 and 163 are both coupled to terminal 254 at which signal $\overline{CS}$ is applied. The drain electrode of FET 162 is coupled to a first electrode of P-channel FET 108, to the drain electrodes of N-channel FETs 256 and 258, to the drain electrode of N-channel FET 160, and to the emitter of transistor 103. Also, the drain electrode of FET 163 is coupled to a second electrode of FET 108, to the source electrodes of N-channel FETs 260 and 262, to the drain electrode of N-channel FET 161, and to the emitter of transistor 104. Which current electrode of P-channel FET 108 functions as a source electrode and which current electrode functions as a drain electrode depends on the respective voltages on bit lines 72 and 73. The gate electrode of FET 108 is coupled to terminal 264 at which the logical AND of signals CS and WE (signal CS·WE) is applied. The source electrode and the drain electrode respectively of N-channel FETs 256 and 260 are respectively coupled to first and second inputs of memory cell 266. Similarly, the source electrode and the drain electrode respectively of N-channel FETs 258 and 262 are respectively coupled to first and second inputs of selected memory cell 268. The gate electrodes of N-channel FETs 256 and 260 are both coupled to terminal 270 at which the signal RSN is applied while the gate electrodes of N-channel FETs 258 and 262 are both coupled to terminal 272 at which the signal RS1 is applied. The bases of transistors 103 and 104 are both coupled to terminal 274 at which signal CS·WE (the inverse of the signal applied to terminal 264) is applied. The collectors of transistors 103 and 104 are coupled to operating potential $V_{DD}$. P-channel FETs 106 and 107 have drain electrodes respectively coupled to the emitters of transistors 103 and 104. The gate electrodes of FETs 106 and 107 are coupled to operating potential $V_{SS}$ while the source electrodes of FETs 106 and 107 are respectively coupled to emitters of transistors 276 and 278. The bases and collectors of transistors 276 and 278 are all coupled to operating potential $V_{DD}$. It is worth noting that transistors 103, 104, 106–108, 276 and 278 function as a bit line load similar to bit line load 74 of FIG. 4, wherein the differences will be highlighted hereinafter.

Returning to FETs 160 and 161, their gate electrodes are coupled to terminal 280 at which signal CS·WE is applied. The source electrode of FET 160 is coupled to an output of write driver 282 while the source electrode of FET 161 is coupled to an output of write driver 284. Further, write driver 282 has inputs for receiving signals D and WE and write driver 284 has inputs for receiving signals $\overline{D}$ and WE.

As a benefit to the reader, an introduction to the signals shown in FIG. 9 is appropriate. Signal $\overline{WE}$ is applied to terminal 252 whereby signal $\overline{WE}$ is a logic low if data is being written to a memory cell and a logic high at all other times. Signal $\overline{CS}$ which is a column select signal is typically provided from a column decoder is applied to terminal 254 whereby signal $\overline{CS}$ is a logic low when the shown column starting with selected memory cell 268 and continuing through memory cell 266 is chosen. Also, signals RS1 and RSN (row select 1 through row select N) are respectively applied to terminals 272 and 270 whereby signal RS1 is a logic high when the row containing selected memory cell 268 is chosen and signal RSN is a logic high when the row containing memory cell 266 is chosen. It should be understood that there are typically a plurality of row memory cells (not shown) similar to selected memory cell 268 and memory cell 266 which would be accessible via signals RS2 − RS(N − 1) (not shown). Further, these memory cells are all suitable to be incorporated on a single integrated circuit. It should also be understood that when signals $\overline{CS}$ and RS1 are in a predetermined logic state, a logic low and a logic high, respectively, selected memory cell 268 is activated. Further, the signal applied to terminal 264 is a signal generated from the logical AND of signals CS and WE while the complement of this signal is applied to terminal 274. It is important to realize that the signal applied to terminal 264 is only a logic high when both signals CS and WE are logic highs. In other words, FET 108 is rendered non-operative only when both signals CS and WE are a logic high which essentially means that a write operation is being performed to one of the memory cells in the chosen column. Likewise, transistors 103 and 104 are rendered non-operative only when a write operation is being performed. Write drivers 282 and 284 respectively provide signals WED and $\overline{WED}$ wherein their respective logic states are dependent upon the logic states of signals D and $\overline{D}$.

During read cycle operation, assume that signals $\overline{CS}$ and RS1 are at a predetermined logic state so that "selected" memory cell 268 is chosen. In other words, N-channel FETs 258 and 262 are rendered operative via signal RS1 and P-channel FETs 162 and 163 are rendered operative via signal $\overline{CS}$. It is worth noting that when FETs 162 and 163 are rendered operative, first and second bit lines are respectively coupled to first and second read data lines. Also, WE is in a logic low during the read mode which correspondingly applies a logic high at the bases of transistors 170 and 171 and renders transistors 170 and 171 operative. Also, FETs 172 and 173 as well as FETs 160 and 161 are rendered non-operative during the read mode. Signal CS·WE is in a logic low state which renders P-channel FET 108 operative. Correspondingly, signal CS·WE is in a logic high state which applies a logic high to the bases of transistor 103 and 104 and renders transistors 103 and 104 operative. It is important to point out that for this embodiment that the voltage level corresponding to a logic high state is substantially equal to operating potential to $V_{DD}$ while the voltage level corresponding to a logic low state is substantially equal to operating potential to $V_{SS}$. Transistors 103, 104, 106, 107 and 108 all function similar to the aforedescribed manner for bit line load 74 of FIG. 4 in that these transistors provide an active pull-up on both bit lines 72 and 73 during the read cycle and equalize and precharge the voltages on bit lines 72 and 73 during the write recovery period as aforedescribed. However, the bit line load in FIG. 9 differs from bit line load 74 in FIG. 4 in at least two ways. First, transistor 101 and resistor 105 of FIG. 4 are not utilized in the embodiment of FIG. 9. Further, transistor 102 of FIG. 4 has been split up into two diode-connected transistors (transistors 276 and 278) to provide a non-linear load that reduces signal attenuation of sense voltage $V_S$.

Since the bases of transistors 170, 171 and 103 and 104 are at a logic high (voltage potential $V_{DD}$), they are all rendered operative and function as diodes since their base and collectors are coupled to substantially equal voltage potentials. This is a fundamental difference between read data line load 154 in FIG. 7 and read data line load 154' in FIG. 9. Transistors 170 and 171 of FIG. 7 are not operative during the read cycle since the voltage levels on their bases are only brought up to a voltage level of approximately a diode drop below the voltage at the base of transistors 103 and 104, via signal SELC. Furthermore, since transistors 170 and 171 as well as transistors 103 and 104 in FIG. 9 are operative during the read cycle, current is allowed to flow through FETs 162 and 163. Also, since FET 108 is operative at all times except during the write cycle, voltage potentials $V_1$, $V_2$, and $V_3$ are respectively developed across FETs 163, 108 and 162. Note that if transistors 170 and 171 were not operative, voltages $V_1$ and $V_3$ would not be generated.

The voltage across the emitters of transistors 170 and 171, denoted by $V_S$, is typically the voltage that is sensed across bit lines 72 and 73 during the read cycle which is then fed into a sense amplifier 155. It is this voltage, $V_S$, in which the present invention intends to make substantially independent of process variation by utilizing voltages $V_2$ as well as $V_1$ and $V_3$. It should be clear from simple nodal analysis that the voltage $V_S$ can be expressed as:

$$V_S = V_1 + V_2 - V_3 \quad (3)$$

where
  $V_1$ is the voltage across the FET 163;
  $V_2$ is the voltage across the FET 108; and
  $V_3$ is the voltage across the FET 162.

Therefore, by utilizing voltages $V_1$, $V_2$, and $V_3$, read voltage $V_S$ becomes the sum and difference of three voltages. Therefore, voltage $V_S$ can be made substantially independent of non-tracking process variations, particularly between the non-tracking process variations of P-channel and N-channel FETs in the memory circuit.

Assume that selected memory cell 268 has a predetermined logic state within its cell such that current $I_0$ flows into FET 258 and the current into FET 262 is negligible wherein $I_0$ is a predetermined current that is typically determined by FET 258. Further, substantially all of the current $I_0$ is provided from operating potential $V_{DD}$ via transistor 103. It is also worth noting that the conductance of FETs 162 and 163 are substantially equal and substantially greater than the conductance of FET 108. Also, since the current through FET 262 is negligible, only a small current flows through transistor 104. Furthermore, since most of current $I_0$ flows through transistor 103 and is sunk into selected memory cell 268, it can be concluded that comparably small amounts of current flow through FETs 162, 163 and 108. Nevertheless, current does flow through FETs 162, 163 and 108 and voltages $V_1$, $V_2$, and $V_3$ are generated. Furthermore, voltages $V_1$, $V_2$, and $V_3$ can be approximated by neglecting the effect of the others. It is also worth noting that transistors 276 and 278 as well as FETs 106 and 107 contribute to the value of current $I_0$, but this contribution is small and can be neglected.

As an illustration, when solving for voltage $V_3$, an adequate approximation can be obtained by neglecting the current flowing through FET 108. Therefore, in order to approximate $V_3$, an equivalent circuit can be obtained as shown in FIG. 10.

Figure 10:
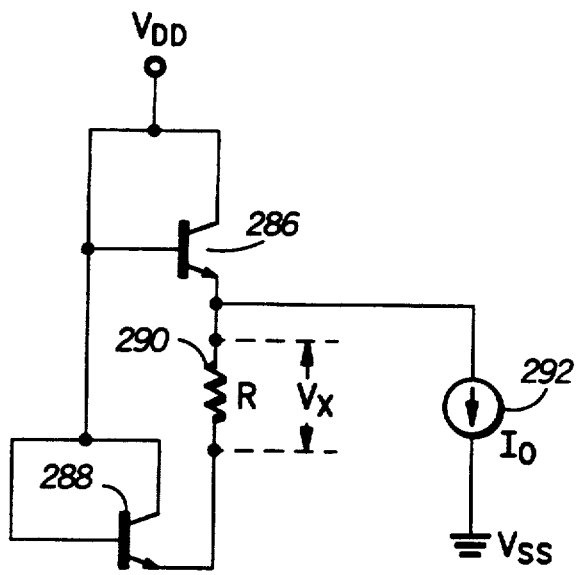
FIG. 10 is a detailed schematic diagram illustrating a simplified equivalent circuit to solve for various voltages that are shown in the circuit of FIG. 9.

Referring to FIG. 10, a detailed schematic diagram illustrating a simplified equivalent circuit to solve for voltages $V_1$, $V_2$ and $V_3$ is shown comprising diode-connected transistors 286 and 288 having both their bases and collectors coupled to operating potentials $V_{DD}$. The emitter of transistor 286 is coupled to the emitter of transistor 288 by resistor 290 (R) and to operating potential $V_{SS}$ by current source 292 which provides a current of value $I_0$. Further, $V_X$ is a voltage occurring across resistor 290 which is representative of either voltage $V_1$, $V_2$ or $V_3$ as will be further explained below.

When approximating voltage $V_3$, $V_X$ represents $V_3$, transistor 286 represents transistor 103, transistor 288 represents transistor 170, and resistor 290 represents the drain-source resistance of FET 162. Note that transistors 103 and 170 are respectively represented by diode-connected transistors 286 and 288 since during the read cycle, their bases are pulled up to substantially $V_{DD}$. It should be clear from the equivalent circuit in FIG. 10 that voltage $V_X$ is dependent upon the value of resistor 290 and current source 292 wherein voltage $V_X$ is generated due to the difference in base-emitter voltages of transistors 286 and 288. Further, voltage $V_X$ will vary with process variation since the current source of value $I_0$ and resistor 290 will vary with process variations. Voltage $V_X$ can be approximated by a transcendental approach wherein the details of this approximation is not important for the subject matter of the present invention. Further, it is believed that one of ordinary skill in the art would be able to approximate voltage $V_X$.

Likewise, assuming that the current through FET 162 is small compared to $I_0$ and utilizing the equivalent circuit of FIG. 10 to approximate voltage $V_2$, voltage $V_X$ represents voltage $V_2$, transistor 286 represents transistor 103, transistor 288 represents transistor 104, and resistor 290 represents the drain-source resistance of FET 108. Finally, voltage $V_1$ can be altogether neglected from the approximation of voltage $V_S$ since the conductance of FET 163 is substantially greater than the conductance of FET 108. Therefore, only a comparably small current is flowing through transistor 104 and an even smaller current is flowing through FET 163. Thus, an adequate approximation of voltage $V_S$ can be expressed simply as the difference of voltages $V_2$ and $V_3$ ($V_S = V_2 - V_3$).

As aforementioned, the details for solving the transcendental approximation is not important, however, what is important is that voltage $V_S$ is essentially comprised of the difference between voltages $V_2$ and $V_3$. This allows $V_S$ to be substantially independent of non-tracking process variation because as process parameters vary up and down, the difference of the voltage ($V_2 - V_3$) will remain substantially constant. Therefore, since a plurality of voltages were utilized in the calculation for voltage $V_S$, the variation of one voltage is essentially negated by the variation of the other voltage and voltage $V_S$ is made substantially independent of non-tracking process variations.

It should be apparent by now that a BICMOS sense circuit for reading data on a read data line pair, which is faster than a design using only MOS transistors and consumes a minimum of power, has been described. In one form, the sense circuit comprises a load 154 and a sense amplifier 155. When the block in which the sense circuit is located is selected during the read cycle, a select signal is asserted. When the select signal is asserted, the load provides a voltage on the read data line pair equal to a predetermined voltage, the predetermined voltage being a logic high voltage of the select signal minus one $V_{BE}$. The predetermined voltage provided by the load rapidly enables the sense amplifier. Then the load becomes inactive, and the selected bit line pair increases the voltage on the read data line pair to the logic high voltage of the select signal, a differential voltage between the read data lines indicating the contents of the selected memory cell. The sense amplifier converts the differential voltage into a differential current on a corresponding read global data line pair. At the end of the read cycle, the select signal is negated, and the load again becomes active to couple the read data lines to the logic low voltage of the select signal. In another form the sense circuit generates a read sense voltage that is substantially independent of non-tracking process variations between P-channel and N-channel field-effect transistors.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A sense circuit comprising:
   first and second bipolar transistors each having both a collector and a base for receiving a select signal, and having emitters respectively coupled to true and complement read data lines of a read data line pair;
   first and second MOS transistors each having a first current electrode for receiving said select signal, a control electrode for receiving a first bias signal, and having second current electrodes respectively coupled to said true and complement read data lines; and
   a sense amplifier having positive and negative input terminals respectively coupled to said true and complement read data lines, a positive output terminal coupled to a first read global data line, and a negative output terminal coupled to a second read global data line, said sense amplifier providing a first differential current between said positive and negative output terminals proportional to a difference in voltage between said positive and negative input terminals when either a voltage on said positive input terminal or a voltage on said negative input terminal exceeds a predetermined voltage, and providing second and third currents each substantially equal to zero respectively to said first and second read global data lines when both said voltage on said positive input terminal and said voltage on said negative input terminal do not exceed said predetermined voltage.

2. The sense circuit of claim 1 wherein a logic high voltage of said select signal is characterized as being greater than said predetermined voltage plus one base-to-emitter diode voltage drop and less than a positive power supply voltage, and a logic low voltage of said select signal is characterized as being less than said predetermined voltage.

3. The sense circuit of claim 2 wherein said sense amplifier comprises:
   a third bipolar transistor having a first current electrode coupled to a first power supply voltage terminal, a base providing said positive input terminal of said amplifier and coupled to said true data line, and an emitter;
   a fourth bipolar transistor having a first current electrode coupled to said first power supply voltage terminal, a base providing said negative input terminal of said amplifier and coupled to said complement data line, and an emitter;
   a third MOS transistor having a first current electrode coupled to said emitter of said third bipolar transistor, a base for receiving a second bias signal, and a second current electrode coupled to a second power supply voltage terminal;
   a fourth MOS transistor having a first current electrode coupled to said emitter of said fourth bipolar transistor, a base for receiving said second bias signal, and a second current electrode coupled to said second power supply voltage terminal;
   a fifth MOS transistor having a first current electrode, a base for receiving said second bias signal, and a second current electrode coupled to said second power supply voltage terminal;
   a fifth bipolar transistor having a collector for providing said negative output terminal of said sense amplifier, a base coupled to said emitter of said third bipolar transistor, and an emitter coupled to said first current electrode of said fifth MOS transistor; and
   a sixth bipolar transistor having a collector for providing said positive output terminal of said sense amplifier, a base coupled to said emitter of said fourth bipolar transistor, and an emitter coupled to said first current electrode of said fifth MOS transistor.

4. In a memory comprising:
   a plurality of memory cells located at intersections of word lines and bit line pairs, and selected when a corresponding word line and a corresponding bit line pair are selected, each memory cell providing a pair of complementary bit line signals to said corresponding bit line pair when selected during a read cycle, and for storing a data bit received on said corresponding bit line pair when selected during a write cycle;
   row decoding means coupled to said word lines, for selecting one word line during either said read cycle or said write cycle in response to a row address; and
   column decoding means coupled to said bit line pairs, for selecting at least one bit line pair, and for coupling said at least one bit line pair to a corresponding read data line pair during said read cycle in response to a column address;
at least one sense circuit, each at least one sense circuit coupled to a corresponding read data line pair and comprising:
   load means coupled to the read data lines, for coupling true and complement read data lines of said corresponding read data line pair to a first predetermined voltage in response to an activation of a select signal, and for coupling said true and complement read data lines to a second predetermined voltage in response to a deactivation of said select signal; and
   amplifier means coupled to said corresponding read data line pair, to a read global data line pair, and to said load means, for converting a voltage difference between said true and complement read data lines into a differential current on corresponding true and complement read global data lines of said read global data line pair, in response to either said true or said complement read data line exceeding a third predetermined voltage, said third predetermined voltage between said first predetermined voltage and said second predetermined voltage;
said load means comprising:
   first and second bipolar transistors each having both a collector and a base for receiving said select signal, and having emitters respectively coupled to said true and complement data lines; and
   first and second MOS transistors each having a first current electrode for receiving said select signal, a control electrode for receiving a first bias signal, and having second current electrodes respectively coupled to said true and complement read data lines.

5. The sense circuit of claim 4 wherein the memory further comprises a bit line load means coupled to said plurality of memory cells and to said column decoding means, for coupling each bit line pair to a voltage greater than said predetermined voltage plus one base-to-emitter diode voltage drop and less than a positive power supply voltage in response to a start of said read cycle.

6. A sense circuit in a memory block for sensing a voltage on true and complement read data lines during a read cycle of the memory block, comprising:

load means coupled to the read data lines, for coupling the true and complement read data lines to a first predetermined voltage in response to an activation of said select signal, and for coupling the true and complement read data lines to a second predetermined voltage in response to a deactivation of said select signal;

means for generating said select signal at said logic high voltage in response to the memory block being selected during the read cycle, and at said logic low voltage otherwise, said logic high voltage being less than a positive power supply voltage; and amplifier means coupled to a corresponding read data line pair, to a read global data line pair, and to said load means, for converting a voltage difference between the true and complement read data lines into a differential current on corresponding true and complement read global data lines of said read global data line pair, in response to either a voltage on the true read data line or a voltage on the complement read data line exceeding a third predetermined voltage, said third predetermined voltage between said first predetermined voltage and said second predetermined voltage, said means for generating said select signal comprising:

a NAND gate having a first input terminal for receiving a block select signal, a second input terminal for receiving a write signal, and an output terminal, said write signal active at a logic low during a write cycle and inactive at a logic high during a read cycle;

an inverter having an input terminal coupled to said output terminal of said NAND gate, and an output terminal, a logic high voltage of said inverter substantially equal to a bias signal;

a first transistor having a collector coupled to a positive power supply voltage terminal, a base for receiving said bias signal, and an emitter;

a second transistor having a collector coupled to said emitter of said first transistor, a base coupled to said output terminal of said inverter, and an emitter for providing said select signal;

a third transistor having a drain coupled to said emitter of said second transistor, a gate coupled to said output terminal of said NAND gate, and a source;

a fourth transistor having a drain coupled to said source of said third transistor, a gate coupled to said output terminal of said inverter, and a source coupled to a negative power supply voltage terminal;

a fifth transistor having a collector coupled to said emitter of said second transistor, a base coupled to said source of said third transistor, and an emitter coupled to said negative power supply voltage terminal; and a sixth transistor having a drain coupled to said emitter of said second transistor, a gate coupled to said positive power supply voltage terminal, and a source coupled to said negative power supply voltage terminal.

* * * * *

UNITED STATES PATENT AND TRADEMARK OFFICE
CERTIFICATE OF CORRECTION

PATENT NO. : 5,229,967
DATED : July 20, 1993
INVENTOR(S) : Scott G. Nogle It is certified that error appears in the above-identified patent and that said Letters Patent is hereby corrected as shown below:

On the title page of the patent under section [76] Inventors:
Please delete "; Robert P. Dixon, 444 N. Gila Springs Blvd., #2062, Chandler, Ariz. 85226; Walter C. Seelbach, 12009 Organ Pipe Cir., Fountain Hills, Ariz. 85267".

There should be only one named inventor and that is Scott G. Nogle

Signed and Sealed this

Twenty-third Day of May, 1995

*Attest:*

BRUCE LEHMAN

*Attesting Officer*     *Commissioner of Patents and Trademarks*